United States Patent
Matsuhira et al.

(10) Patent No.: US 7,303,943 B2
(45) Date of Patent: Dec. 4, 2007

(54) METHOD OF MANUFACTURING ELECTRIC DEVICE

(75) Inventors: Tsutomu Matsuhira, Chiba (JP); Hideaki Adachi, Chiba (JP); Keiichiro Hayashi, Chiba (JP); Tadahiro Nishigawa, Fukushima (JP); Nobukazu Koizumi, Fujisawa (JP)

(73) Assignees: Seiko Instruments Inc (JP); Toray Advanced Film Co., Ltd. (JP); Maruwa Corporation (JP)

( * ) Notice: Subject to any disclaimer, the term of this patent is extended or adjusted under 35 U.S.C. 154(b) by 250 days.

(21) Appl. No.: 10/960,168

(22) Filed: Oct. 7, 2004

(65) Prior Publication Data

US 2006/0079026 A1 Apr. 13, 2006

(51) Int. Cl.
*H01L 21/00* (2006.01)

(52) U.S. Cl. .............................. 438/115; 257/E21.499

(58) Field of Classification Search ................. 438/115
See application file for complete search history.

(56) References Cited

U.S. PATENT DOCUMENTS

| | | | | |
|---|---|---|---|---|
| 5,919,329 A | * | 7/1999 | Banks et al. | 156/281 |
| 5,970,319 A | * | 10/1999 | Banks et al. | 438/115 |
| 6,146,503 A | * | 11/2000 | Sindzingre et al. | 204/164 |
| 6,261,866 B1 | * | 7/2001 | Marinis et al. | 438/115 |
| 6,318,621 B1 | * | 11/2001 | Marinis et al. | 228/4.1 |
| 6,383,842 B1 | * | 5/2002 | Takashima et al. | 438/115 |
| 6,468,833 B2 | * | 10/2002 | Uner et al. | 438/115 |
| 6,551,860 B2 | * | 4/2003 | Uner et al. | 438/115 |

* cited by examiner

*Primary Examiner*—David A. Zarneke
(74) *Attorney, Agent, or Firm*—Adams & Wilks

(57) ABSTRACT

In a method of manufacturing an electric device, moisture in a film substrate is reduced by heating the film substrate at a temperature in the range of 80° C. to 100° C. Thereafter, an IC is mounted on the film substrate.

7 Claims, 1 Drawing Sheet

METHOD OF MANUFACTURING ELECTRIC DEVICE

BACKGROUND OF THE INVENTION

The present invention relates to an electric device, such as a cellular device, having a configuration in which ICs such as drivers, memories, and controllers for driving a display panel are mounted facedown. More specifically, the present invention relates to a method of mounting an IC used in an electric device, a method of manufacturing a film substrate on which an IC is mounted, and an electronic device having a semiconductor device that is mounted by using these methods.

With conventional techniques, for example when an IC for driving a display device is mounted facedown, a plating bump or a stud bump is formed on an IC pad, and the IC is bonded to a film substrate having polyimide as a base by using an anisotropic conductive film, thus maintaining a connection. Alternatively, a silver paste is transferred to the bump and connected to a film substrate, thus filling in an under-fill therebetween and maintaining a connection.

Further, when a connection is made by using metallic diffusion, a process involving connecting a solder bump on an IC to an electrode of a film substrate to fill the under fill, and a process involving performing Sn plating on an electrode of a film substrate side and making a connection with an Au bump of the IC by using Au—Sn eutectic bonding to fill the under fill, are performed.

ICs each having a bump pitch of 45 μm and 900 electrodes have been used in recent years for ICs that drive display panels. Au—Sn eutectic connecting is typically used in order to mount at a 45 μm pitch. In order to manufacture a film substrate, a 30 Å of a seed layer made from nickel or the like is sputtered onto a polyimide film, which becomes a base material, and 2,000 Å of copper is then sputtered. The seed layer is formed in order to adhere to the copper. In addition, electrolytic plating is performed so that the total conductor thickness becomes approximately 8 μm. This type of conductor is then patterned by using a photolithography method, forming electrodes. Approximately 0.15 to 0.25 μm of pure tin is then formed on the electrodes by using non-electrolytic tin plating. In addition, solder resist is formed, thus completing the film substrate. Heat and pressure are then applied to ICs, thus completing facedown connections of the ICs onto the electrodes on the film substrate thus manufactured. In addition, the under fill is filled in and hardened in order to ensure connection reliability. There are also cases where resistors or capacitors are surface mounted. In addition, this film substrate is connected to a display panel by using an anisotropic conductive film. Elongation of the polyimide film occurs owing to heat applied when making connections, and connection terminals of the display panel and the film substrate deviate. In order to prevent this position deviation, a method in which thermal compression bonding, which had been performed in bulk, is divided up (JP 05-249479 A, for example) or a method in which the pitch of the film substrate is corrected in advance (JP 2000-312070 A, for example) has been employed.

The miniaturization of ICs progresses year by year, and mass production has begun in which 40-μm pitch ICs are mounted onto a film substrate. The examination of additionally fine pitch ICs has been progressing in order to reduce the IC surface area and decrease costs. On the other hand, when forming a straight bump, a space of 13 μm and a bump width of 15 to 17 μm are the limits at which mass production can be stably performed. Accordingly, the pad pitch of ICs that can be mass produced at present is 30 μm. However, with ICs each having more than 1,000 pins, a mounting position deviation develops with the film substrate even when using a 30-μm pitch bump arrangement. This position deviation is a phenomenon in which the cumulative pitches of the IC and the film substrate do not match, and is a phenomenon in which edge portion terminals greatly deviate when the IC and the film substrate are aligned at a center terminal. One possible cause of this phenomenon is the occurrence of the thermal deformation in the film substrate due to heat during mounting. In particular, a connection portion is heated to 350 to 380° C. with Au—Sn eutectic connecting, and deviations occur even if polyimide having high heat resistance is used. Pattern reduction may be performed at fixed scaling over an entire film substrate pattern, or over only an IC mounting portion, in order to correct elongation portions. Although the degree of deviation reduces for a pattern on which correction has been performed, elongation dispersion develops. Accordingly, this correction alone does not lead to resolving the cause.

Manufacturing the film substrate by using a rolling method is thought to be another cause. In this case, manufacturing is performed by using a 200 to 500-width raw material. Finished products are laid out and manufactured by freely arranging the finished products at 0°, 90°, 180°, and 270° on the raw material, and further, alternate finished products are arranged by rotating by 180° so that the maximum number taken out increases. The raw material of the film is uniaxially oriented polyimide, and the characteristics thereof in a flow direction (MD: Machine Direction) differ from those in a width direction (TD: Transfer Direction). According to the physical characteristics published by the film manufacturer, even though the strength, the elongation ratio, the Young's modulus, the thermal contraction ratio, the thermal expansion coefficient, and the moisture expansion coefficient have identical characteristic values in the MD and in the TD, in practice, the characteristics of dimensional change differ between the MD and the TD. Further, due to the layout of the finished products on the film substrate raw material, a connection edge of the IC may be in the MD direction or in the TD direction.

Further, dispersion in the initial dimensions of the film substrate is one large cause. There is typically a ±0.06% dispersion per unit length in the initial dimensions of a film substrate that uses a material in which a metallic thin film is sputtered onto a polyimide film, and copper electrodes are formed by electroplating. Although it is expected that a pattern mask for the film substrate has fixed conditions and is stable, with almost no dispersion, the dimensions of the finished products are not stable. The reasons for this are that dimensional change occurs at temperature with the characteristics of the polyimide film of the film substrate, and dimensional change occurs in a wet state and a dry state. For example, with Kapton 100EN of Du Pont-Toray Co., Ltd., the thermal expansion coefficient is 16 ppm/° C. in both the MD and the TD, and the moisture expansion coefficient is 15 ppm/% RH in both the MD and the TD. This influence is a cause of dimensional dispersion of the film substrate.

Dispersion in the cumulative pitch dimension of a film substrate at present is ±0.06% before mounting, even in the TD direction having good dimensional precision. A dispersion of ±0.10% develops after gold-tin eutectic connecting. In order to mount at a 30 μm pitch, with 17-mm long IC chips, the amount of permissible deviation between the bumps and the pattern of the film substrate after mounting is ±10 μm.

However, deviation dispersion due to a mounting apparatus is approximately ±5 μm, and the cumulative pitch dispersion before mounting is approximately ±10 μm with a current film substrate. A dispersion of ±17 μm thus occurs after mounting. The amount of position deviations of the IC and the film substrate after mounting has a dispersion of one half of ±17 μm, or ±8.5 μm, because the dimensional dispersion of the film after mounting is allocated to both ends with a center reference. Combining this with the dispersion of the mounting apparatus, a maximum total of ±13.5 μm results. Accordingly, many failures occur, and costs are high, when mounting 17-mm long IC chips at a 30 μm pitch.

In order to achieve 30-μm pitch mounting by using 17-mm ICs, the dimensional precision required for the film substrate is an initial cumulative pitch dispersion of ±3 μm, and a cumulative pitch dispersion after mounting of ±10 μm. A permissible value for dispersion in connecting respective electrodes can be set within ±10 μm by combining the dimensional precision of the substrate and the mounting position dispersion of the mounting apparatus. Consequently, it is necessary to make the initial dimensional dispersion of the film substrate approximately ±0.02%, which is equal to or less than half of the conventional dispersion, and it is necessary to make the precision after gold-tin eutectic mounting approximately ±0.05%.

The causes of dimensional dispersion in the film substrate are also similar when connecting to a display panel.

SUMMARY OF THE INVENTION

In order to achieve high density mounting of ICs on a film substrate, the present invention provides a low cost electric device and display device, in which mounting yield is increased by increasing the cumulative pattern pitch precision of the film substrate and by decreasing the amount of extension from bonding, thus increasing the dimensional precision of the film substrate after mounting.

In order to solve the problems described above, a method of manufacturing an electric device of the present invention includes the steps of: reducing moisture in a film substrate; and mounting an IC onto the film substrate. In other words, the IC is mounted facedown after a state where there is substantially no moisture in the film substrate is made. Water absorbed by the film substrate is a cause of dispersion, and moisture expansion can be made substantially zero by substantially removing the moisture to place the film substrate in a dry state. Accordingly, the film substrate before mounting has extremely stable dimensions. The term "dry state" as used here refers to a state where the amount of moisture in a film is equal to or less than 0.1 Wt %.

A heating temperature becomes equal to or greater than 100° C. when mounting the IC onto the film substrate, and the temperature of the film accordingly rises rapidly. Moisture in the film substrate thus evaporates in an instant. This was a large cause of greatly increasing the expansion of the film. However, the moisture in the film substrate is reduced or is completely removed by subjecting the film substrate to drying processing before mounting the IC. Consequently, the dimensional dispersion of the film substrate during IC mounting can be greatly reduced.

Alternatively, a method of manufacturing an electric device according to the present invention is one in which, after a substrate has been left for at least a fixed period of time or greater under a constant temperature and humidity environment, an IC is mounted facedown. The precision is thus inferior to that of the dry state, but from the standpoint of productivity, the need for time management from the dry state until mounting becomes unnecessary.

Further, a method of manufacturing a display device according to the present invention is one in which an IC is mounted facedown after a film substrate has been placed in a dry state, and in addition, the film substrate on which the IC is mounted is then placed in a dry state and connected to a display panel by using an anisotropic conductive film or the like.

Furthermore, a method of manufacturing a film substrate in which a metallic wiring is formed on a polymer film according to the present invention is one in which, after the metal has been formed on the polymer film, the metal and the polymer film are placed in a dry state, and a pattern is then formed by etching, thus increasing the cumulative pattern precision of the film substrate.

Further, for cases where a film substrate is taken from a dry state to a clean room environment, for example, at 25° C. and 60% for IC mounting, the dimensional dispersion thereof is 17,062.9±6.8 μm in the dry state, but becomes 17,065.1±3.5 μm when held for 24 hours under the conditions mentioned above. The length of the film substrate extends by approximately 2 μ, but the dispersion decreases by approximately 50%.

DESCRIPTION OF THE PREFERRED EMBODIMENT

Figure 1A:
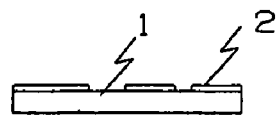
FIG. 1 is a schematic drawing that explains a method of manufacturing a liquid crystal display device.

Methods of manufacturing an electric device, a semiconductor element, and a display device according to the present invention are methods in which moisture absorbed by a film is removed in order to stabilize a pattern pitch of a film substrate, and the film is placed in a dry state. A cumulative pattern pitch thus stabilizes, and amounting process is performed in that state. Further, a method of manufacturing a film substrate according to the present invention is a method in which moisture absorbed by a film is removed in order to stabilize a pattern pitch of a film substrate, and the film is placed in a dry state, after which a pattern is formed.

In other words, a method of manufacturing an electric device of the present invention having a film substrate on the surface of which an IC is mounted includes the steps of: reducing moisture in the film substrate; and mounting an IC onto the film substrate. The amount of moisture in the film is reduced to an amount equal to or less than 0.1 Wt % here in the step of reducing moisture in the film substrate. Alternatively, the method includes the steps of: placing a film substrate under a constant temperature and humidity environment for a fixed period of time or longer; and mounting an IC onto the film substrate. The constant temperature and humidity environment here is an environment that is identical with an environment under which the step of mounting the IC is performed.

Further, a method of manufacturing a film substrate on which metallic wirings are formed on a polymer film according to the present invention includes the steps of: forming a metallic thin film on the polymer film; performing drying processing to reduce moisture in the polymer film; and patterning metallic wirings after performing the drying processing. Alternatively, the method includes: a first step of forming a metallic thin film on a polymer film; a second step of placing the polymer film under a constant temperature and humidity environment for a fixed period of time or longer; and a step of patterning metallic wirings after the second step.

When the film substrate has a backing film applied for use in conveying, or even when the film substrate does not have a backing film applied, the influence of base material curling and the like is eliminated by performing patterning after placing the film substrate in a dry state before patterning, and the cumulative patterning precision can be increased.

Further, according to the present invention, a method of manufacturing a semiconductor element in which an IC chip is mounted onto wirings formed on a film includes: a first step of forming wirings on a film; a second step of making the amount of moisture in the film on which the wirings are formed equal to or less than 0.1 Wt %; and a step of bonding an IC chip to the wirings after the second step. Alternatively, the method includes: a first step of forming wirings on a film; a second step of placing the film on which the wirings are formed under a fixed temperature and humidity environment for a fixed period of time or longer; and a step of bonding an IC chip to the wirings.

In addition, the first step includes: a step of forming a metallic thin film on the film; a drying processing step of making the amount of moisture in the film equal to or less than 0.1 Wt %; and a step of forming wirings by means of patterning after the drying processing step. Alternately, the first step includes: a step of forming a metallic thin film on the film; a conditioning processing step of placing a polymer film under a constant temperature and humidity environment for a fixed period of time or longer; and a step of forming wirings by means of patterning after the conditioning processing step.

Further, a method of manufacturing a display device according to the present invention includes the steps of: forming a film substrate having wirings; bonding an IC to the wirings to form a semiconductor element; making the amount of moisture in the film substrate equal to or less than 0.1 Wt %; and connecting the film substrate to display elements. Alternatively, the method includes the steps of: forming a film substrate having wirings; bonding an IC to the wirings to form a semiconductor element; placing the film substrate under a constant temperature and humidity environment for a fixed period of time or longer; and connecting the film substrate to a display panel. In addition, the semiconductor element used here is a semiconductor element manufactured by using any one of the methods of manufacturing a semiconductor element that are described above. Alternatively, the film substrate used here is a film substrate manufactured by using any one of the methods of manufacturing a film substrate that are described above.

In each of the methods described above, the elongation ratio caused by dimensional changes due to the humidity of Kapton EN for cases where the film substrate is placed in a 25° C. and 60% environment from a dry state is 0.025% at 30 minutes, 0.04% at one hour, becomes 0.05% at 100 hours, and substantially stabilizes thereafter. Accordingly, the shorter the amount of time from the dry state until processing, the better.

Further, the film may be kept under a constant temperature and humidity environment after the moisture absorbed by the film has been removed to make a substantially dry state, and then processing may move to the next processing step. By keeping the film under the constant temperature and humidity environment, an absorbed water state for moisture within the film is stabilized. The cumulative pattern pitch thus stabilizes under the atmosphere, and processing moves to the next step in this state. The constant temperature and humidity condition at this point may have the same conditions as those of the environment under which the following processing step is performed.

Embodiments of the present invention are explained below with reference to the drawings.

Embodiment 1

FIG. 1 is a schematic diagram that explains a method of manufacturing a display device according to this embodiment. FIG. 1(a) shows an initial state of a film substrate. This is a film substrate in which a pattern 2 is formed on a 25-μm thick polyimide film 1. In this embodiment, processing is performed to remove moisture absorbed by the film to make a substantially dry state, before the formation of the pattern on the film.

In order to make the substantially dry state, the film substrate and silica gel are placed in a bag having airtight properties, a storage container, or the like, and held for 24 hours. Alternatively, the film substrate is placed as it is in a refrigerator with silica gel and held for 24 hours. It is necessary to take sufficient care when placing the film substrate and silica gel in a refrigerator because there is a possibility of condensation developing after opening. Further, when heating processing is performed in order to remove the moisture absorbed by the film, the heating processing is performed by using an oven at 80° C. for 30 minutes to 100° C. for 15 minutes.

The pattern is formed here of a 30-Å Ni alloy formed on the polyimide film, a 4 to 8-μm thickness of Cu formed on this Ni alloy layer by means of sputtering and electrolytic plating, and a 0.15 to 0.25-μm thick non-electrolytic tin plating formed on a surface. Examples of patterning methods include subtractive methods, semi-additive methods, and additive methods. Solder resist may also be formed when necessary. In this case, tin plating is typically performed after resist formation. However, a thin film tin plating may also be formed before resist formation, and then a pure tin layer may be formed to 0.15 to 0.25 μm after resist formation.

Figure 2:
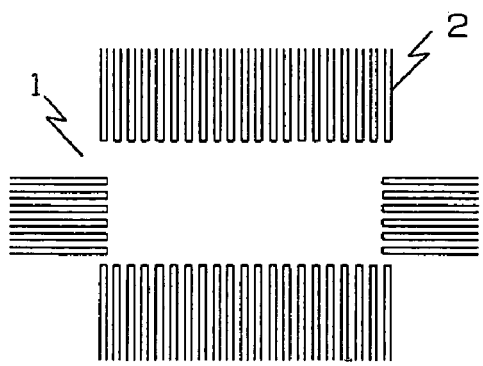
FIG. 2 is an upper surface view that schematically shows a pattern arrangement of a film substrate.

FIG. 2 is an upper surface view showing a simplified pattern for mounting a formed IC onto a film substrate. A longitudinal side of the IC is taken as a TD direction of the film, and a transverse side of the IC is taken as an MD direction of the film. A pattern having a rectangular shape or the like may also be established on an inner side that connects to the IC. There are 572 electrodes formed at a pitch of 30 μm on the longitudinal side, and 140 electrodes formed at a pitch of 30 μm on the transverse side. Combining four sides, 1,424 electrodes are formed. The electrode width is formed to be 10±2 μm.

In this embodiment, processing for removing moisture absorbed by the film in order to make a substantially dry state is performed after the formation of the pattern on the film. In order to make the substantially dry state, the film substrate and silica gel are placed in a bag having airtight properties, a storage container, or the like, and held for 24 hours. Alternatively, the film substrate is placed as it is in a refrigerator with silica gel and held for 24 hours. It is necessary to take sufficient care when placing the film substrate and silica gel in a refrigerator because there is a possibility of condensation developing after opening. Further, when heating processing is performed in order to remove the moisture absorbed by the film, the heating processing is performed by using an oven at 80° C. for 30 minutes to 100° C. for 15 minutes.

Figure 1B:
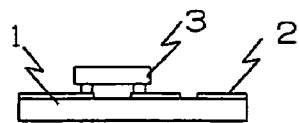
Figure 3:
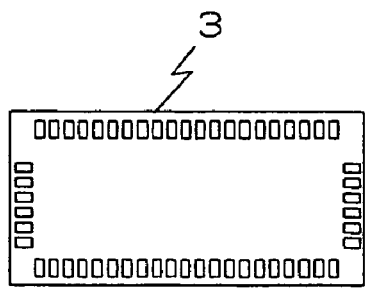
FIG. 3 is an upper surface view that schematically shows a bump arrangement of a circuit surface of an IC.

FIG. 1(b) is a side surface view in which an IC 3 is mounted facedown to the film substrate in a dry state. 0.5 mm of silicon and Au bumps each having a height of 17 μm are formed on the IC 3. The bump is formed by means of electrolytic plating after opening an area formed by means of photoresist. The photoresist is removed after formation. FIG. 3 is a view of a circuit surface of the IC 3 seen from an upper surface. The IC 3 is of a long chip shape, and external shape dimensions of the IC 3 are 17.48×4.5 mm. Similar to the film substrate, there are 572 bumps on the longitudinal side, and 140 bumps on the transverse side. That is, a total of 1424 bumps are formed. The width of each of the bumps is formed to 17 μm, and a space between the bumps is formed to 13 μm. The bumps are connected to the electrodes of the film substrate through gold-tin eutectic bonding. The connection conditions in this case are to apply a load of 13 kg from the IC 3 side by using a tool at 440° C., and to maintain the load for 2 seconds.

It is necessary to quickly use the film substrate removed from the dry environment for a mounting step. It is necessary to perform mounting within a time period of approximately 60 minutes. When performing mounting by using heating processing, the tin plating of the film substrate diffuses under heat treatment conditions at the gold-tin eutectic connecting, and it is thus necessary to apply a tin plating that is thicker than normal.

When the copper thickness is 8 μm, with respect to the dimensional precision of the film substrate after drying processing, a dispersion 17.130 mm in the longitudinal side (TD) of the film substrate is ±0.04% before mounting, while the dimensional dispersion becomes ±0.046% after mounting. The dimensional dispersion 4.17 mm in the transverse side (MD) of the film substrate is ±0.086% before mounting, while the dimensional dispersion becomes ±0.0711% after mounting. This is an improvement compared to a conventional film substrate. Further, when the copper thickness is 4 μm, the dimensional dispersion of the film substrate after drying processing is ±0.036% in the longitudinal side (TD) before mounting, while the dimensional dispersion becomes ±0.0145% after mounting. The dimensional dispersion in the transverse side (MD) of the film substrate is ±0.1176% before mounting, while the dimensional dispersion becomes ±0.0802% after mounting. There is additional stability with the thinner copper.

In this embodiment, the film substrate is taken out after drying processing into a 23° C. and 55% environment, and the IC is mounted facedown. Moisture absorption of the film substrate thus advances. It is also very important to make not only the period of time until mounting but also the humidity of the mounting atmosphere as small as possible in order to make the amount of moisture absorbed by the film substrate as little as possible. Further, each of a method involving performing drying processing to the film substrate and then performing IC mounting in a vacuum state, and a method involving performing drying processing to the film substrate and then performing IC mounting in a nitrogen purged environment is the most preferable method to be used as a method of IC mounting without moisture being absorbed by the film.

There are also gold-gold thermocompression bonding, ultrasonic connecting, anisotropic conductive films, NCP, and the like for IC mounting methods, in addition to gold-tin eutectic connecting. Dispersions can similarly be made smaller whichever method is used.

Figure 1C:
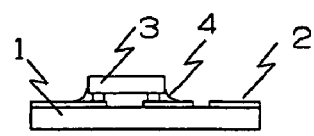
Figure 1D:
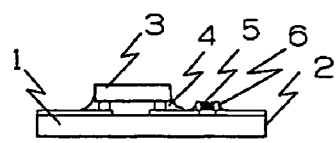

FIG. 1(c) is a side surface view that shows a state in which an under fill is injected and hardened. The under fill is applied in a dot shape or a linear shape on a side surface of the IC 3, filled in, and then hardened by using heat. FIG. 1(d) is a side surface view after solder mounting. A chip resistor 5 is connected by soldering. In addition to chip resistors, capacitors, packaged ICs, inductors, connectors, and the like also exist as mounting parts.

Figure 1E:
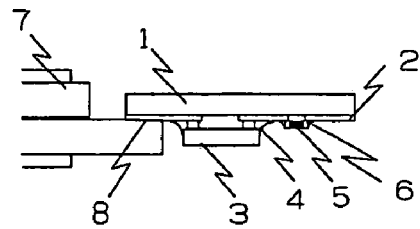

FIG. 1(e) is a side view of a flexible substrate shown in FIG. 1(d) after mounting of a display panel 7. An anisotropic conductive film 8 is applied to a terminal portion of the display panel 7, and the film substrate is aligned. In a state of maintaining the alignment, tacking is performed at room temperature or at a temperature at which the anisotropic conductive film 8 does not harden. Temperature conditions under which a resin of the anisotropic conductive film will harden, and load conditions under which connecting particles of the anisotropic conducive film will rupture to contact each other are then applied, connecting the display panel and the film substrate. Tacking may also be omitted, depending upon the circumstances.

Further, for cases where the film substrate is connected to the display panel, stable dimensional precision can also be obtained by placing the film substrate in a substantially dry state and then performing alignment and bonding.

Although processing for placing the film substrate in a substantially dry state is performed in this embodiment before the formation of the pattern on the film substrate and before the mounting of the IC onto the pattern on the film substrate, a certain level of effect can also be obtained by performing processing at any one of these points.

Embodiment 2

An embodiment of the present invention is explained below. In this embodiment, a method of regulating the amount of moisture in a film differs from that of Embodiment 1. Other manufacturing methods, however, are basically similar to those of Embodiment 1, and explanations thereof are suitably omitted.

In Embodiment 1, processing for removing moisture absorbed by the film is performed in order to make a substantially dry state, but a method like that described below is performed in this embodiment. That is, processing is performed to place the film substrate for 24 hours under an environment identical to the environment under which mounting is performed. The environment is 22° C. and 60% in this embodiment, for example. Time management until processing the film substrate is not necessary when performing this processing. The dimensional change ratio at 25° C. due to moisture in Kapton EN, which is used in the film in this embodiment, is 0.025% at 30 minutes, 0.04% at 1 hour, and 0.05% at 100 hours, and substantially stable thereafter. The dimensional precision of the film substrate when conditioning processing of the film substrate is performed under the processing conditions described above is as follows. When the thickness of copper foil is 8 μm, with respect to the dimensional precision of the film substrate, a dispersion in the longitudinal side (TD) of the film substrate is ±0.02% before mounting, and is ±0.053% after mounting. The dimensional dispersion in the transverse side (MD) of the film substrate is ±0.0713% before mounting, while the dimensional dispersion becomes ±0.0998% after mounting. This is an improvement compared to a conventional film substrate. Further, when the thickness of copper foil is 4 μm, the dimensional dispersion of the film substrate is ±0.031% in the longitudinal side (TD) before mounting, and ±0.024% after mounting. The dimensional dispersion in the transverse side (MD) is ±0.1056% before mounting, while the dimensional dispersion becomes ±0.1023% after mounting. There is additional stability with the thinner copper foil.

The dimensions of the film substrate are stable with the conditioning processing according to this embodiment compared to the drying processing of Embodiment 1, but the dimensional precision after mounting is better with drying processing. This is probably due to the influence of heat during mounting and the influence of moisture within the film. Further, the fact that the thinner copper foil has higher dimensional stability is the same trend in both processing methods.

Further, for cases where the film substrate is connected to the display panel, stable dimensional precision can also be obtained by performing alignment and bonding after performing conditioning processing by placing the film substrate under an environment that is identical to the environment under which mounting is performed.

Embodiment 3

A method of manufacturing a film substrate on which an IC is mounted facedown is explained below. A film substrate is used in this embodiment configured by applying a film such as polyethylene terephthalate used in conveying, according to a thickness, to a raw material in which a metallic thin film is formed on a polyimide film. A patterning resist is formed on the film substrate, and light exposure and developing are performed. Then, a pattern is formed by using an etching liquid and the patterning resist is removed. Patterning of the film substrate is thus performed. In the present invention, drying processing or conditioning processing is performed on the film immediately prior to light exposure. In this embodiment, heating processing for 30 minutes at 150° C. is taken as a condition for drying processing, while placement for 24 hours under a constant environment of 23° C. and 55% is taken as a condition for conditioning processing.

The dimensional change ratio of the TD side of the film substrate is measured below for a film substrate to which a backing polyethylene terephthalate film is applied, and for a film substrate to which a backing film is not applied, for cases where conditioning by placing under a constant environment or drying processing is performed before a light exposure step. Measurements are shown in Table 1. Raw materials for the film substrates used here are Kapton EN of Du Pont-Toray Co., Ltd., having a low CTE and a thickness of 25 μm, as a polyimide film and a metallic thin film in which copper is formed to a thickness of 8 μm by means of electrolytic copper plating after several tens of angstroms of a special nickel alloy are evaporated and copper is then continuously sputtered.

TABLE 1

|  | With Polyethylene Terephthalate Film | Without Polyethylene Terephthalate Film |
| --- | --- | --- |
| Drying processing | ±0.02812% | ±0.02089% |
| 23° C. 55% · 24 h standing | ±0.04787% | ±0.04911% |

As is clear from the measurements of Table 1, the dimensional change ratio is not influenced by the presence or absence of the polyethylene terephthalate film used in conveying. Further, dispersion in the cumulative pitch dimensions of a conventional film substrate is ±0.06% in the TD direction, which has good dimensional stability. Dimensional changes can be reduced by performing any of the processes of this embodiment. Further, performing drying processing before light exposure can reduce the dimensional changes by approximately 50% more than placing the substrate for 24 hours at 23° C. and 55%.

Embodiment 4

A method of manufacturing a display device according to the present invention is explained in detail below. A method of manufacturing a display device that is realized by combining each of the embodiments described above is explained in this embodiment.

First, drying processing of a film substrate is performed before the formation of a pattern made form a metallic thin film on a polyimide film used for the raw material of a film substrate. The dimensional precision of patterning thus increases. It is effective to perform drying processing immediately before light exposure. As for conditions of drying processing, heating processing is performed at 150° C. for 30 minutes, for example.

Next, an IC is then, or after performing conditioning processing, connected (mounted) on this film substrate, and sealing is performed, thus forming a semiconductor element. Additional conditioning processing is next performed on the semiconductor element, and the semiconductor element and a display element pattern (terminals) are aligned and connected. It is preferable to perform the conditioning processing under an environment close to an environment under which subsequent processing is performed. Specific conditions are placement for 24 hours at a temperature of 23° C. and a humidity of 55%. The pattern precision thus increases, and it becomes possible to reduce dispersion and the amount of position deviations. Fine connections can also be stably achieved.

According to the present invention, a low cost electric device and display device can be provided by handling high precision IC chips, and by virtue of stable yield and cost reductions of downsized ICs. Further, a film substrate having little dimensional dispersion can be provided.

What is claimed is:

1. A method of manufacturing an electric device comprising:
   providing a film substrate;
   reducing moisture in the film substrate by heating the film substrate at a temperature in the range of 80° C. to 100° C.; and
   mounting an IC on the film substrate after reducing the moisture in the film substrate.

2. A method of manufacturing an electric device according to claim 1; wherein in the step of reducing moisture in the film substrate, an amount of moisture in the film substrate is made equal to or less than 0.1 wt %.

3. A method of manufacturing an electric device according to claim 1; wherein the step of mounting the IC on the film substrate is performed within 60 minutes from the step of reducing the moisture in the film substrate.

4. A method of manufacturing an electric device according to claim 1; wherein the step of mounting the IC on the film substrate is performed in a vacuum state.

5. A method of manufacturing an electric device according to claim 1; wherein the step of mounting the IC on the film substrate is performed in a nitrogen purged environment.

6. A method of manufacturing an electric device according to claim 1; further comprising a conditioning processing step between the step of reducing the moisture in the film substrate and the step of mounting the IC on the film substrate for maintaining the film substrate in a humidity environment under a constant temperature.

7. A method of manufacturing an electric device according to claim 6; wherein the IC is mounted on the film substrate under the same humidity environment and constant temperature condition as in the conditioning processing step.

* * * * *